United States Patent
Karpov et al.

(10) Patent No.: US 7,709,822 B2
(45) Date of Patent: May 4, 2010

(54) PHASE CHANGE MEMORY AND MANUFACTURING METHOD THEREOF

(75) Inventors: Ilya V. Karpov, Santa Clara, CA (US); Charles C. Kuo, Union City, CA (US); Yudong Kim, Cupertino, CA (US); Greg Atwood, San Jose, CA (US)

(73) Assignee: STMicroeletronics S.r.l., Agrate Brianza (IT)

( * ) Notice: Subject to any disclaimer, the term of this patent is extended or adjusted under 35 U.S.C. 154(b) by 180 days.

(21) Appl. No.: 11/771,601

(22) Filed: Jun. 29, 2007

(65) Prior Publication Data
US 2008/0029752 A1    Feb. 7, 2008

Related U.S. Application Data

(63) Continuation of application No. PCT/EP2005/056921, filed on Dec. 19, 2005.

(30) Foreign Application Priority Data
Dec. 30, 2004    (EP) .................................. 04107071

(51) Int. Cl.
*H01L 47/00* (2006.01)
(52) U.S. Cl. ...................... 257/4; 257/E45.002; 438/95
(58) Field of Classification Search ................. 257/1–4, 257/E27.004, E45.001, E45.002, 467; 365/51, 365/163, 148
See application file for complete search history.

(56) References Cited

U.S. PATENT DOCUMENTS

| | | | |
|---|---|---|---|
| 5,920,788 A * | 7/1999 | Reinberg | 438/466 |
| 6,420,725 B1 | 7/2002 | Harshfield | |
| 6,507,061 B1 * | 1/2003 | Klersy et al. | 257/295 |
| 7,135,696 B2 * | 11/2006 | Karpov et al. | 257/2 |
| 2002/0016054 A1 | 2/2002 | Doan et al. | |

FOREIGN PATENT DOCUMENTS

| | | |
|---|---|---|
| EP | 1475840 A1 | 11/2004 |
| WO | 2004/055916 A2 | 7/2004 |

* cited by examiner

*Primary Examiner*—Kenneth A Parker
*Assistant Examiner*—Paul A Budd
(74) *Attorney, Agent, or Firm*—Lisa K. Jorgenson; Robert Iannucci; Seed IP Law Group PLLC (57) ABSTRACT

Both a chalcogenide select device and a chalcogenide memory element are formed within vias within dielectrics. As a result, the chalcogenides is effectively trapped within the vias and no glue or adhesion layer is needed. Moreover, delamination problems are avoided. A lance material is formed within the same via with the memory element. In one embodiment, the lance material is made thinner by virtue of the presence of a sidewall spacer; in another embodiment no sidewall spacer is utilized. A relatively small area of contact between the chalcogenide used to form a memory element and the lance material is achieved by providing a pin hole opening in a dielectric, which separates the chalcogenide and the lance material.

30 Claims, 7 Drawing Sheets

PHASE CHANGE MEMORY AND MANUFACTURING METHOD THEREOF

BACKGROUND

1. Technical Field

This invention relates generally to phase change memories.

2. Description of the Related Art

Phase change memory devices use phase change materials, i.e., materials that may be electrically switched between a generally amorphous and a generally crystalline state, for electronic memory application. One type of memory element utilizes a phase change material that is electrically switched between a structural state of generally amorphous and generally crystalline local order or between different detectable states of local order across the entire spectrum between completely amorphous and completely crystalline states. The state of the phase change materials is also non-volatile in that, when set in either a crystalline, semi-crystalline, amorphous, or semi-amorphous state representing a resistance value, that value is retained until changed by another programming event, as that value represents a phase or physical state of the material (e.g., crystalline or amorphous). The state is unaffected by removing electrical power.

Figure 1:
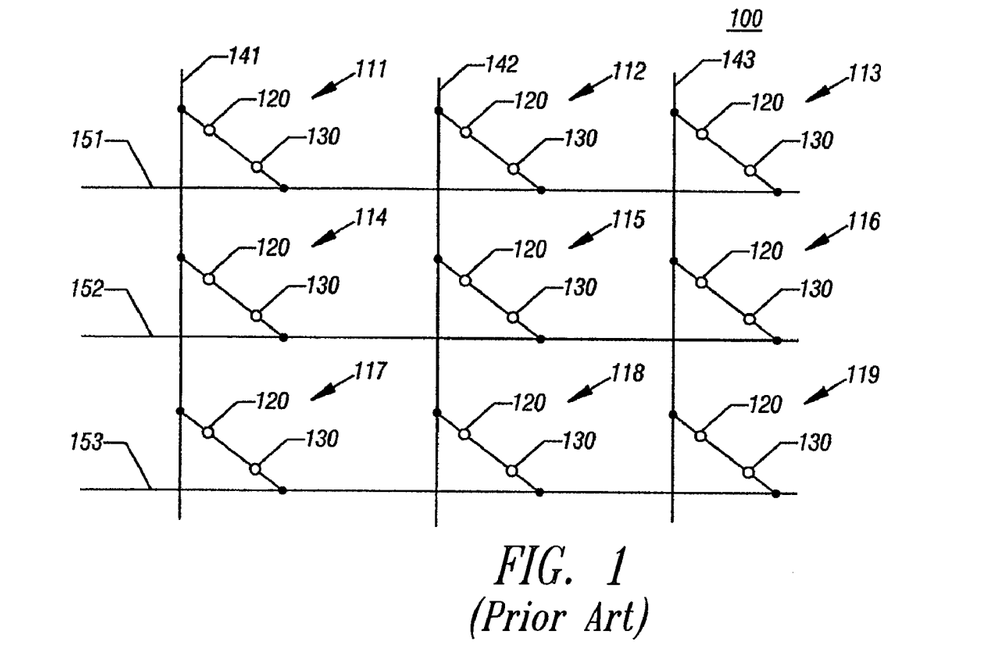
FIG. 1 is a schematic diagram illustrating the scheme of a phase change memory.

FIG. 1 shows the scheme of a phase change memory 100. Memory 100 includes an array of n×n memory cells 111-119, each including a select device 120 and a memory element 130. Memory 100 may have any number of memory cells.

Memory elements 130 comprises a phase change material, thus memory 100 may be referred to as a phase change memory. A phase change material is a material having electrical properties (e.g. resistance, capacitance, etc.) that may be changed through the application of energy such as, for example, heat, light, voltage potential, or electrical current. Examples of a phase change material may include a chalcogenide material.

A chalcogenide alloy may be used in a memory element or in an electronic switch. A chalcogenide material is a material that includes at least one element from column VI of the periodic table or a material that includes one or more of the chalcogenic elements, e.g., any of the elements of tellurium, sulfur, or selenium.

Memory 100 includes column lines 141-143 and row lines 151-153 to select a particular memory cell of the array during a write or read operation. Column lines 141-143 and row lines 151-153 may also be referred to as address lines since these lines may be used to address memory cells 111-119 during programming or reading. Column lines 141-143 may also be referred to as bit lines and row lines 151-153 may also be referred to as word lines.

Memory elements 130 are connected to row lines 151-153 and are coupled to column lines 141-143 via select device 120. While one select device 120 is depicted, more select devices may also be used. Therefore, when a particular memory cell (e.g., memory cell 115) is selected, voltage potentials are applied to the column line (e.g., 142) and row line (e.g., 152) associated with the memory cell 115 to apply a voltage potential across it.

Series connected select device 120 is used to access memory element 130 during programming or reading of memory element 130. A select device is an ovonic threshold switch that is made of a chalcogenide alloy that does not exhibit an amorphous to crystalline phase change and which undergoes rapid, electric field initiated change in electrical conductivity that persists only so long as a holding voltage is present. Select device 120 operates as a switch that is either "off" or "on" depending on the amount of voltage potential applied across the memory cell, and more particularly whether the current through the select device exceeds its threshold current or voltage, which then triggers the device into the on state. The off state is a substantially electrically nonconductive state and the on state is a substantially conductive state, with less resistance than the off state. In the on state, the voltage across the select device is equal to its holding voltage $V_H$ plus I×Ron, where Ron is the dynamic resistance from $V_H$.

For example, select devices 120 have threshold voltages and, if a voltage potential less than the threshold voltage of a select device 120 is applied across select device 120, then at least one select device 120 remains "off" or in a relatively high resistive state so that little or no electrical current passes through the memory cell and most of the voltage drop from selected row to selected column is across the select device. Alternatively, if a voltage potential greater than the threshold voltages of select device 120 is applied across select device 120, then the select device 120 "turns on," i.e., operate in a relatively low resistive state so that electrical current passes through the memory cell. In other words, select device 120 are in a substantially electrically nonconductive state if less than a predetermined voltage potential, e.g., the threshold voltage, is applied across select device 120. Select device 120 is in a substantially conductive state if a potential greater than the predetermined voltage potential is applied across select device 120. Select device 120 may also be referred to as an access device, an isolation device, or a switch.

Each select device 120 comprises a switching material such as, for example, a chalcogenide alloy, and may be referred to as an ovonic threshold switch, or simply an ovonic switch. The switching material of select device 120 is a material in a substantially amorphous state positioned between two electrodes that may be repeatedly and reversibly switched between a higher resistance "off" state (e.g., greater than about ten MΩ) and a relatively lower resistance "on" state (e.g., about one thousand Ohms in series with $V_H$) by application of a predetermined electrical current or voltage potential. Each select device 120 is a two terminal device that has a current-voltage (I-V) characteristic similar to a phase change memory element that is in the amorphous state. However, unlike a phase change memory element, the switching material of select device 120 does not change phase. That is, the switching material of select device 120 is not a programmable material, and, as a result, select device 120 is not a memory device capable of storing information. For example, the switching material of select device 120 may remain permanently amorphous and the I-V characteristic may remain the same throughout the operating life. A representative example of I-V characteristics of select device 120 is shown in FIG. 2.

Figure 2:
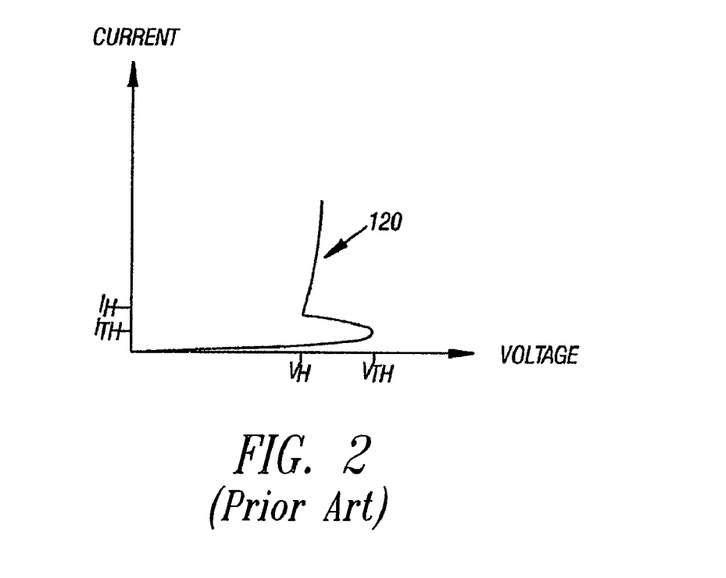
FIG. 2 is a diagram illustrating a current-voltage characteristic of an access device.

Turning to FIG. 2, in the low voltage or low electric field mode, i.e., where the voltage applied across select device 120 is less than a threshold voltage (labeled $V_{TH}$), select device 120 is "off" or non-conducting, and exhibits a relatively high resistance, e.g., greater than about 10 megaOhms. Select device 120 remains in the off state until a sufficient voltage, e.g., $V_{TH}$, is applied, or a sufficient current is applied, e.g., $I_{TH}$, that switches select device 120 to a conductive, relatively low resistance on state. After a voltage potential of greater than about $V_{TH}$ is applied across select device 120, the voltage potential across select device 120 drops ("snapback") to a holding voltage potential, labeled $V_H$. Snapback refers to the voltage difference between $V_{TH}$ and $V_H$ of a select device.

In the on state, the voltage potential across select device 120 remains close to the holding voltage of $V_H$ as current passing through select device 120 is increased. Select device 120 remains on until the current through select device 120 drops below a holding current, labeled $I_H$. Below this value, select device 120 turns off and returns to a relatively high resistance, nonconductive off state until the $V_{TH}$ and $I_{TH}$ are exceeded again.

Processes for manufacturing memory cells of the above discussed type are known, but they are susceptible of improvement.

BRIEF SUMMARY OF THE INVENTION

One embodiment of the invention is a scalable OUM/OTS memory cell which may be fabricated in an all-damascene process flow.

BRIEF DESCRIPTION OF THE SEVERAL VIEWS OF THE DRAWINGS

For a better understanding of the present invention, preferred embodiments thereof are now described, simply as a non-limiting example, with reference to the attached figures, wherein.

DETAILED DESCRIPTION

Figure 3:
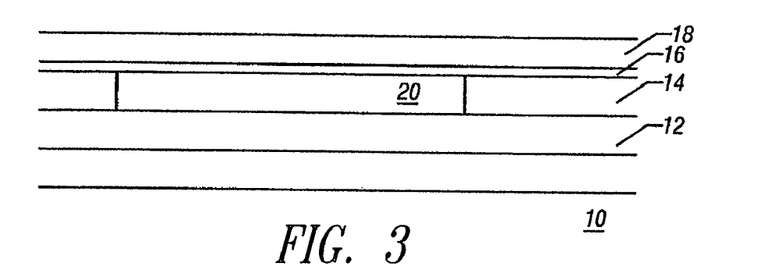
FIGS. 3-14 are enlarged, cross-sectional views of one embodiment of the present invention at subsequent stages of manufacture.

Referring to FIG. 3, a phase change memory cell, such as a cell 111-119 (FIG. 1), is formed on a substrate 10. Over the substrate there is an interlayer dielectric 12. Semiconductor integrated circuits including field effect transistors are formed in and over the substrate 10. Over the interlayer dielectric 12 is a dielectric 14 such as an oxide. Formed within the dielectric 14 is an electrode 20 such as a row line 151-153 (FIG. 1).

Over the electrode 20 is a damascene structure including a nitride layer 16 covered by an oxide layer 18.

Figure 4:
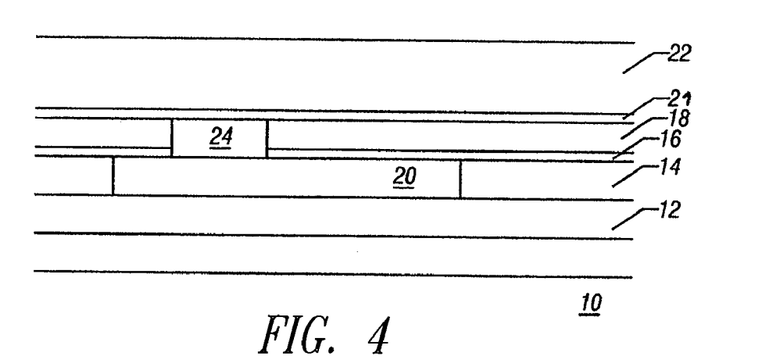

As shown in FIG. 4, a switching material 24 is formed in the oxide layer 18 and the nitride layer 16 and forms a phase change memory select device 120 (FIG. 1). Because the switching material 24 is formed within a via or trench, issues with respect to adhesion to surrounding layers may be avoided. Namely, overlying layer 21 (as below explained) is adequately secured to the layer surrounding the switching material 24, as underlying layers 14, 20, effectively trapping the switching material 24 therein.

A nitride layer 21 and another oxide layer 22 are formed over the switching material 24. The oxide layer 22 is shown thicker than other oxide layers herein for illustration purposes only and may be the same, similar, or less than other oxide layers depicted in terms of thickness.

Figure 5:
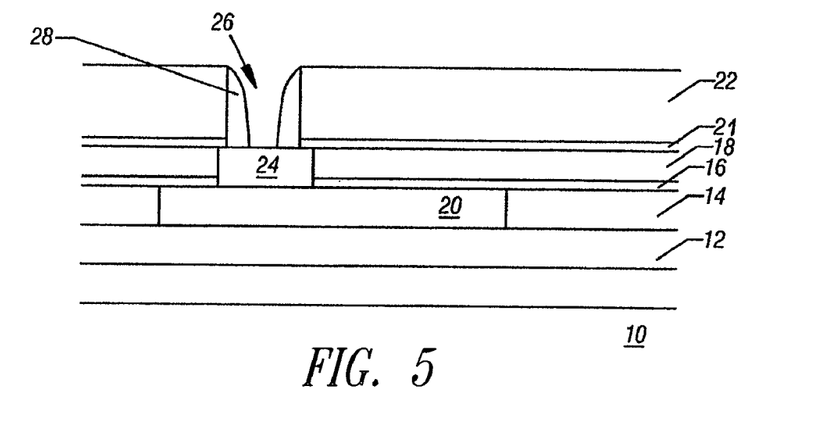

Referring to FIG. 5, a trench 26 is formed in the oxide layer 22 and nitride layer 21 and a sidewall spacer 28 is formed therein. In one embodiment, the sidewall spacer 28 is formed of nitride. The nitride is anisotropically etched to create spacers 28 in accordance with a well known spacer creation process. The trench 26 is formed using dry or wet etch chemistry, as two examples.

Figure 6:
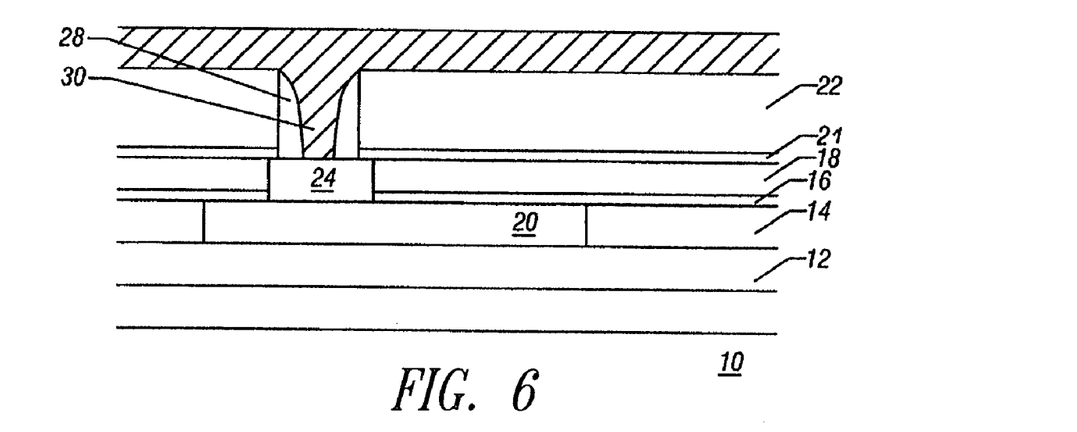

Then, referring to FIG. 6, a heater lance material 30 is deposited. In one embodiment, the lance material 30 is titanium silicon nitride. The material 30 is a material which is effective to heat a subsequently applied overlying phase change material when current passes through the material 30. Thus, it advantageously has high or higher resistance.

Figure 7:
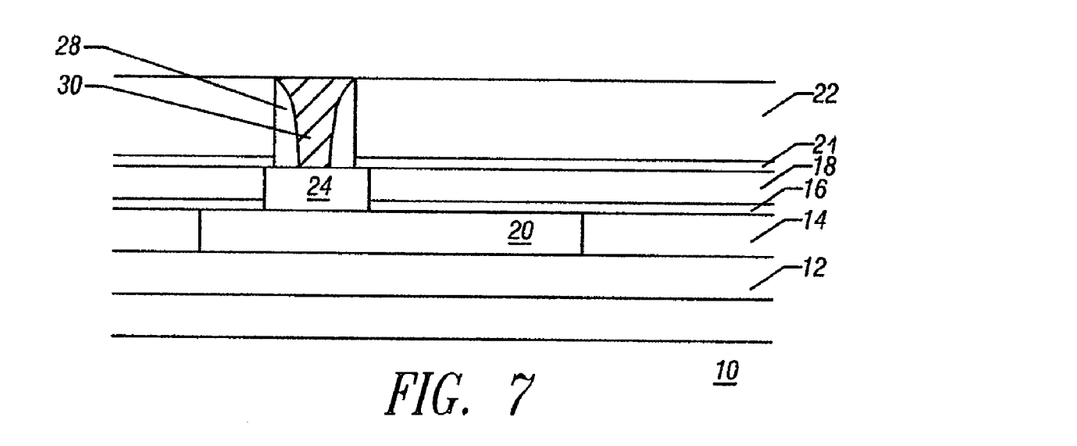
Figure 8:
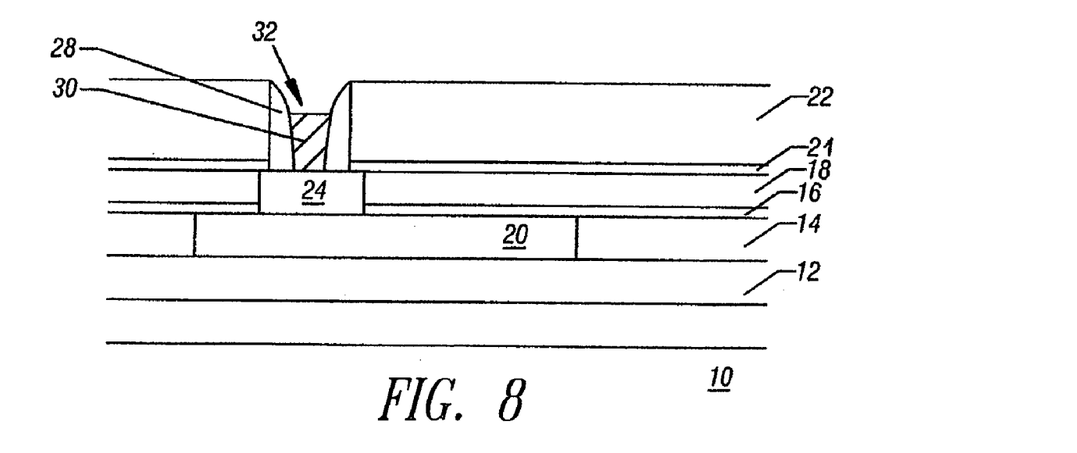

Referring to FIG. 7, the lance material 30 is planarized. Then, as shown in FIG. 8, the lance material is etched back or dipped back using dry or plasma processes or, alternatively, using wet etch technologies. As a result, a gap or etch back region 32 is created.

Figure 9:
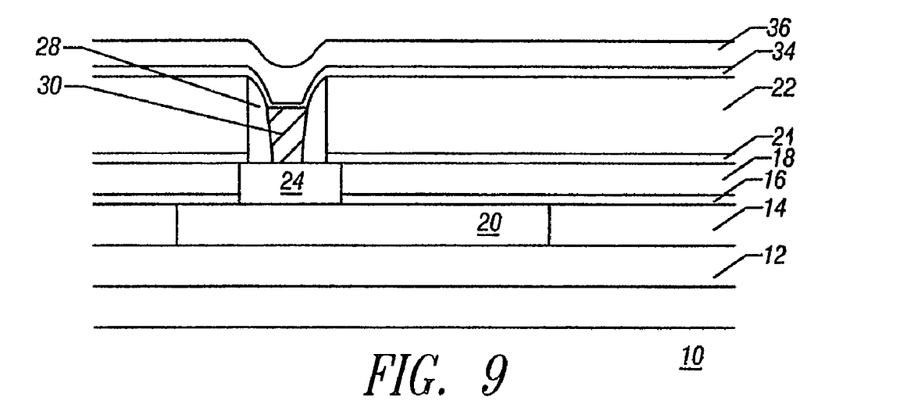

Then, referring to FIG. 9, the region 32 is first covered with a thin dielectric layer 34 and a thicker spacer layer 36. Preferably, the layers 36 and 34 are formed of different materials. For example, the layer 36 may be formed of nitride and the layer 34 may be formed of oxide.

Figure 10:
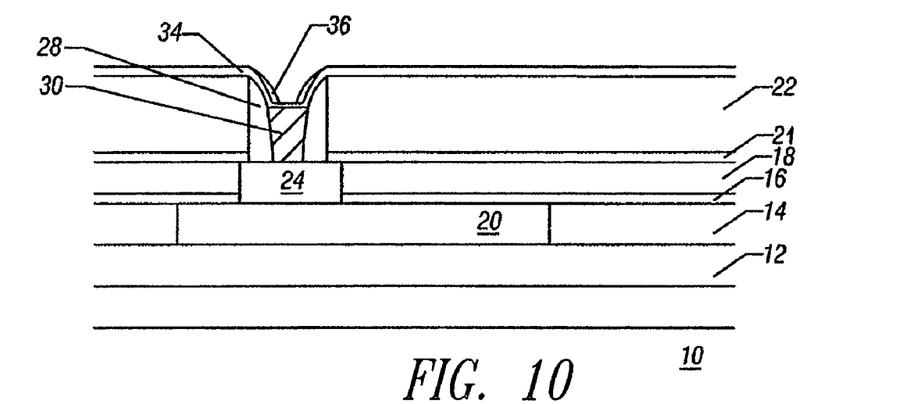
Figure 11:
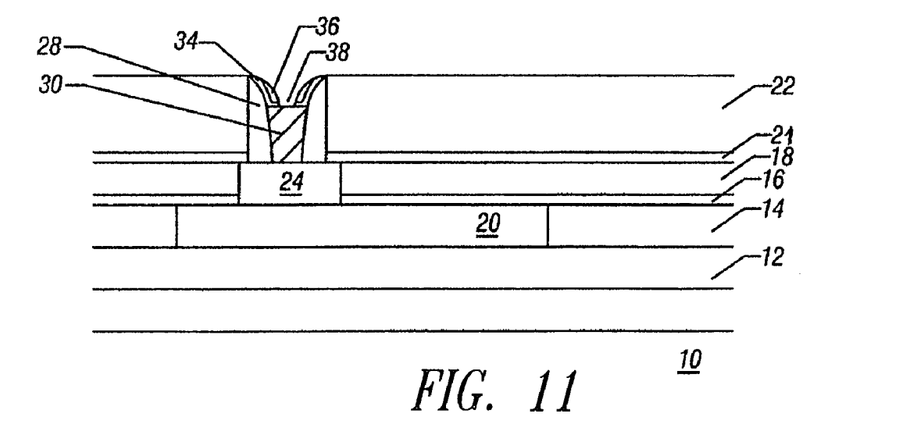

Referring next to FIG. 10, a spacer etch is performed to form the sidewall spacer 36 within the cavity 32. The sidewall spacer 36 then may act as a mask for the etching of the intervening dielectric layer 34. As a result, a small or pin hole aperture 38 (FIG. 11) is formed through the dielectric layer 34 using the spacer 36 as a mask.

Figure 12:
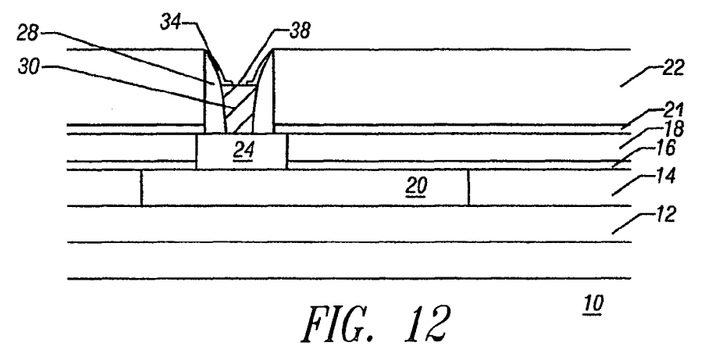

Then, as shown in FIG. 12, the spacer 36 is removed using an etch selective to the spacer 36 material, relative to the layers 22 and 34. Thus, it is also desirable that the spacer 36 be formed of a material different from the layers 34 and 22 so that the layer 36 is selectively etched away.

Figure 13:
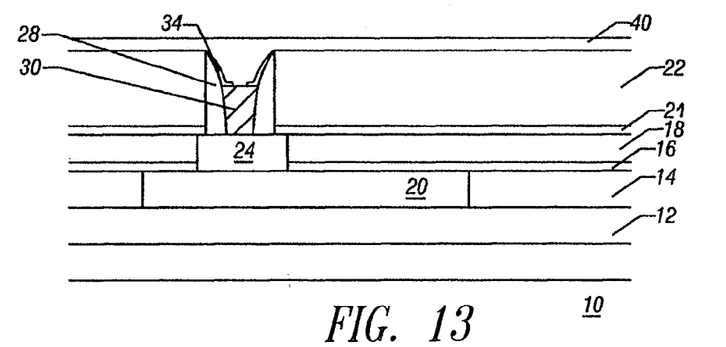
Figure 14:
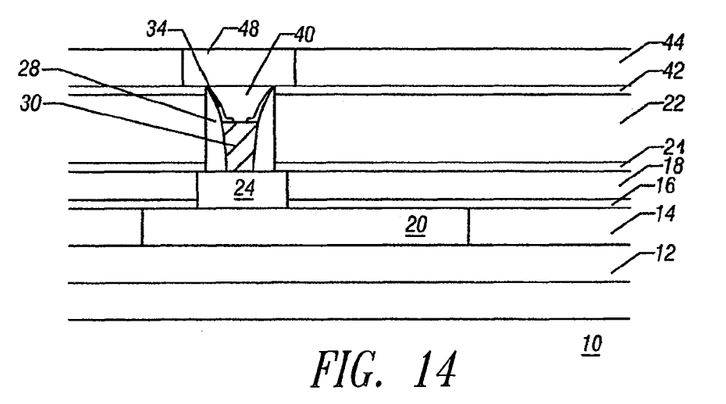

Next, as shown in FIG. 13, a memory material 40 of a chalcogenide is deposited to form the phase change memory element 130 (FIG. 1). Thereafter, as shown in FIG. 14, the memory material 40 is planarized. Dielectric layers 42 and 44 are formed thereover. An opening is formed through these layers and an upper electrode 48 is formed in the dielectric layers 44 and 42. The electrode 48 may correspond to a column line 141-143 in FIG. 1. In one embodiment, the layer 44 may be oxide and the layer 42 may be nitride.

Thereby, an all damascene process can realize relatively small critical dimensions, without the use of hard masks. Since the select device 120 is arranged adjacent to the lance material 30, which acts as a heater, there is no need for an additional electrode between the two. However, in some cases, such an electrode is provided. In addition, in some embodiments of the present invention, the resulting memory material 40 and the memory element 130 formed thereby are self-aligned to the heater formed by the lance material 30. In addition, because both memory material 40 and switching material 24 are captured within trenches or vias, adhesion or glue layers may not be needed.

Figure 15:
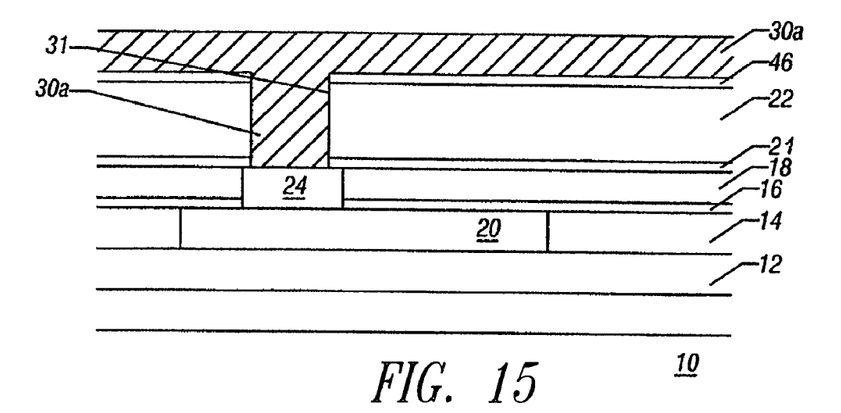
FIGS. 15-17 are enlarged, cross-sectional views at subsequent stages of manufacture in accordance with another embodiment of the present invention.

In accordance with another embodiment of the present invention, the structure shown in FIG. 4 is covered by a nitride layer 46 and then etched to form an aperture 31 in the oxide layer 22 and the nitride layers 46, 21 as shown in FIG. 15. Then, aperture 31 is filled with lance material 30a, such as titanium silicon nitride. Notice that, compared to the structures shown in FIGS. 5-14, no spacer is first provided initially. Thereby, it is easier to deposit the lance material 30a because a wider opening is available.

Figure 16:
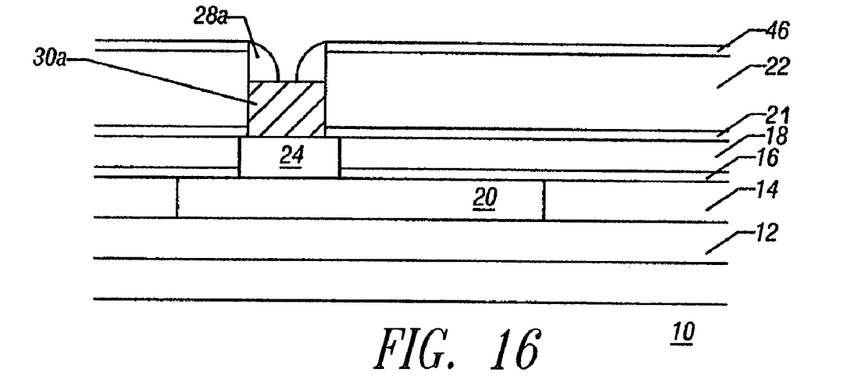

Next, as shown in FIG. 16, the lance material 30a is etched back or dipped back by a plasma or wet etch process, as two examples. The lance material 30a is planarized prior to etch back or dip back. Then a sidewall spacer 28a is formed in the aperture 31, by depositing and then anisotropically etching back a spacer layer, to form the structure depicted in FIG. 16.

Figure 17:
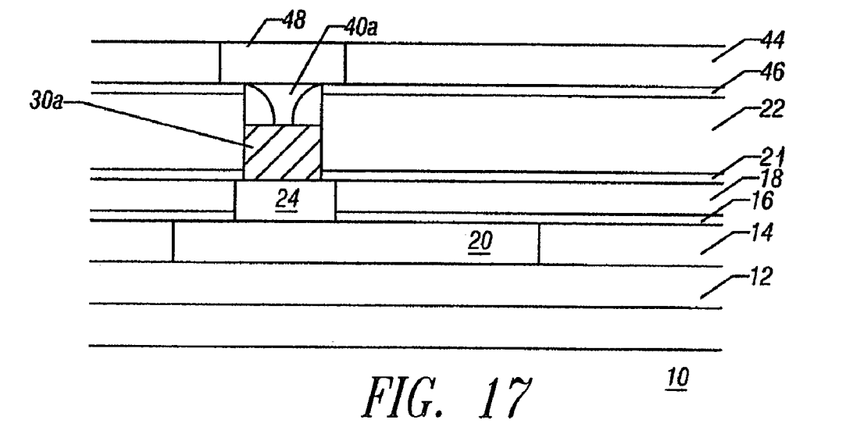

Next, as shown in FIG. 17, a memory material 40a is deposited and planarized. Thereafter, the oxide layer 44 is formed and the upper conductor 48 is arranged in contact with the memory material 40a, analogously to the steps described for FIG. 14.

Memory material 40, 40a, in FIGS. 1-17, is a phase change, programmable material capable of being programmed into one of at least two memory states by applying a current to alter the phase thereof between a substantially crystalline state and a substantially amorphous state, wherein a resistance of memory material 40, 40a in the substantially amorphous state is greater than the resistance of memory material 40, 40a in the substantially crystalline state.

Programming of memory material 40, 40a to alter the state or phase thereof is accomplished by applying voltage potentials to conductors 20 and 48, thereby generating a voltage potential across select device 120 and memory element 130. When the voltage potential is greater than the threshold voltage of select device 120 and memory element 130, then an electrical current may flow through memory material 40, 40a in response to the applied voltage potential, and may result in heating of memory material 40, 40a.

This heating may alter the memory state or phase of memory material 40, 40a and thus may alter the electrical characteristic thereof, e.g., the resistance. Memory material 40, 40a may also be referred to as a programmable resistive material.

In the "reset" state, memory material 40, 40a is in an amorphous or semi-amorphous state and in the "set" state, memory material 40, 40a is in an a crystalline or semi-crystalline state. The resistance of memory material 40, 40a in the amorphous or semi-amorphous state is greater than the resistance of memory material 40, 40a in the crystalline or semi-crystalline state. It is to be appreciated that the association of reset and set with amorphous and crystalline states, respectively, is a convention and that at least an opposite convention may be adopted.

Using electrical current, memory material 40, 40a is heated to a relatively higher temperature to amorphosize and "reset" memory material 40, 40a (e.g., program memory material 40, 40a to a logic "0" value). Heating the volume of memory material 40, 40a to a relatively lower crystallization temperature may crystallize and "set" memory 40, 40a (e.g., program memory material 40, 40a to a logic "1" value). Various resistances of memory material 40, 40a may be achieved to store information by varying the amount of current flow and duration through the volume of memory material 40, 40a.

Although the scope of the present invention is not limited in this respect, lance material 30, 30a may be titanium (Ti), titanium nitride (TiN), titanium tungsten (TiW), carbon (C), silicon carbide (SiC), titanium aluminum nitride (TiAlN), titanium silicon nitride (TiSiN), polycrystalline silicon, tantalum nitride (TaN), some combination of these films, or other suitable conductors or resistive conductors compatible with memory material 40, 40a.

Although the scope of the present invention is not limited in this respect, in one example, the composition of switching material 24 may comprise a Si concentration of about 14%, a Te concentration of about 39%, an As concentration of about 37%, a Ge concentration of about 9%, and an In concentration of about 1%. In another example, the composition of switching material 24 may comprise a Si concentration of about 14%, a Te concentration of about 39%, an As concentration of about 37%, a Ge concentration of about 9%, and a P concentration of about 1%. In these examples, the percentages are atomic percentages which total 100% of the atoms of the constituent elements.

In another embodiment, a composition for switching material 24 may include an alloy of arsenic (As), tellurium (Te), sulfur (S), germanium (Ge), selenium (Se), and antimony (Sb) with respective atomic percentages of 10%, 21%, 2%, 15%, 50%, and 2%.

Although the scope of the present invention is not limited in this respect, in other embodiments, switching material 24 may include Si, Te, As, Ge, sulfur (S), and selenium (Se). As an example, the composition of switching material 24 may comprise a Si concentration of about 5%, a Te concentration of about 34%, an As concentration of about 28%, a Ge concentration of about 11%, a S concentration of about 21%, and a Se concentration of about 1%.

Conductors 20, 48 are a thin film material having a thickness ranging from about 20 Å to about 2000 Å. In one embodiment, the thickness of the conductor 20, 48 may range from about 100 Å to about 1000 Å. In another embodiment, the thickness of the conductor 20, 48 is about 300 Å. Suitable materials may include a thin film of titanium (Ti), titanium nitride (TiN), titanium tungsten (TiW), carbon (C), silicon carbide (SiC), titanium aluminum nitride (TiAlN), titanium silicon nitride (TiSiN), polycrystalline silicon, tantalum nitride (TaN), some combination of these films, or other suitable conductors or resistive conductors compatible with memory material 40, 40a.

Figure 18:
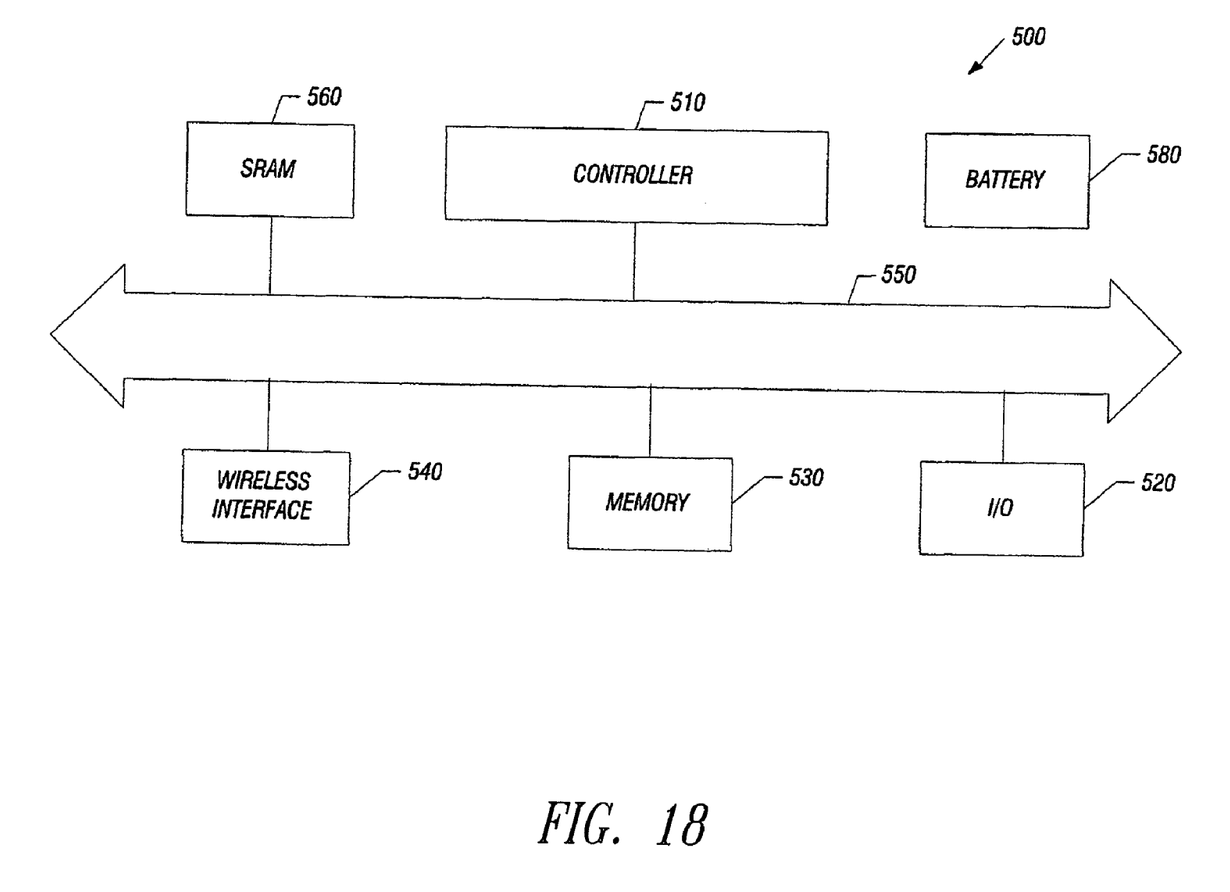
FIG. 18 is a system depiction of one embodiment of the present invention.

Turning to FIG. 18, a portion of a system 500 in accordance with an embodiment of the present invention is described. System 500 may be used in wireless devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. System 500 may be used in any of the following systems: a wireless local area network (WLAN) system, a wireless personal area network (WPAN) system, or a cellular network, although the scope of the present invention is not limited in this respect.

System 500 includes a controller 510, an input/output (I/O) device 520 (e.g. a keypad, display), a memory 530, a wireless interface 540, and a static random access memory (SRAM) 560 and coupled to each other via a bus 550. A battery 580 supplies power to the system 500 in one embodiment.

Controller 510 comprises, for example, one or more microprocessors, digital signal processors, micro-controllers, or the like. Memory 530 may be used to store messages transmitted to or by system 500. Memory 530 may also optionally be used to store instructions that are executed by controller 510 during the operation of system 500, and may be used to store user data. Memory 530 comprises the crosspoint memory 100 illustrated in FIG. 1.

The I/O device 520 is used to generate a message. The system 500 uses the wireless interface 540 to transmit and receive messages to and from a wireless communication network with a radio frequency (RF) signal. Examples of the wireless interface 540 include an antenna, or a wireless transceiver.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method comprising:
   forming a first dielectric layer;
   forming a switch of first chalcogenide material extending though a via in the first dielectric layer, said switch being part of a select device;
   forming a heater positioned directly on and in contact with the switch;
   forming a second dielectric layer; and
   forming a memory element of a second chalcogenide material in a via formed in the second dielectric layer, said heater being positioned between the switch and the memory element.

2. The method of claim 1, including forming said second dielectric layer above said first dielectric layer.

3. The method of any of claim 1, including forming a spacer in said via in said second dielectric layer.

4. The method of claim 3, including forming the heater in an opening left after forming the spacer in said via in said second dielectric layer.

5. The method of claim 4, including forming a dielectric over said heater.

6. The method of claim 5, including forming a spacer over said dielectric.

7. The method of claim 6, including forming an aperture through said dielectric using said spacer as a mask.

8. The method of claim 7, including removing said spacer over said dielectric.

9. The method of claim 7, wherein forming said memory element includes forming said memory element in said aperture in said dielectric to contact said heater.

10. A phase change memory comprising:
    a first dielectric layer;
    a switch of a first chalcogenide material extending through a via in said first dielectric layer, said switch being part of a select device;
    a heater positioned directly on and in contact with the switch;
    a second dielectric layer; and
    a memory element of a second chalcogenide material positioned in a via formed in said second dielectric layer, said heater being positioned between the switch and the memory element.

11. The phase change memory of claim 10, wherein said second dielectric layer is over said first dielectric layer.

12. The phase change memory of claim 10, including a spacer in said via in said second dielectric layer and positioned laterally of the memory element and above the switch.

13. The phase change memory of claim 12, wherein said heater is within said spacer in said via in said second dielectric layer.

14. The phase change memory of claim 10, including a dielectric over said heater.

15. The phase change memory of claim 14, including an aperture through said dielectric.

16. The phase change memory of claim 15, wherein said memory element is in said aperture in said dielectric and in contact with said heater.

17. A system comprising:
    a processor;
    a static random access memory coupled to said processor; and
    a phase change memory coupled to said processor, said phase change memory including:
    a first dielectric layer;
    a switch of chalcogenide material extending through a via in said first dielectric layer, said switch being part of a select device;
    a heater positioned directly on and in contact with the switch;
    a second dielectric layer; and
    a memory element of chalcogenic material positioned in a via formed in said second dielectric layer, said heater being positioned between the switch and the memory element.

18. The system of claim 17, further comprising:
    an interface coupled to said processor, said interface being a wireless interface.

19. The system of claim 17, wherein said second dielectric layer is over said first dielectric layer.

20. The system of claim 19, including a dielectric layer over said heater.

21. The system of claim 20, including an aperture through said dielectric.

22. The system of claim 21, wherein said memory element is in said aperture in said dielectric and in contact with said heater.

23. The system of claim 17, including a spacer in said via in said second dielectric layer and positioned laterally of the memory element and above the switch.

24. The system of claim 23, wherein said heater is within said spacer in said via in said second dielectric layer.

25. A phase change memory comprising:
    a first dielectric layer;
    a via in said first dielectric layer, said via including a chalcogenide material for a select device;
    a second dielectric layer over the first dielectric layer;
    a via formed in said second dielectric layer, said via including a chalcogenide material for a memory element;
    a heater above said select device and below said memory element; and
    a dielectric over said heater.

26. The phase change memory of claim 25, including an aperture through said dielectric.

27. The phase change memory of claim 26, wherein said memory element chalcogenide material is in said aperture in said dielectric in contact with said heater.

28. A system comprising:
    a processor;
    a static random access memory coupled to said processor; and
    a phase change memory coupled to said processor, said phase change memory including:
    a first dielectric layer;
    a via in said first dielectric layer, said via including a chalcogenide material for a select device;
    a second dielectric layer over said first dielectric layer;
    a via formed in said second dielectric layer, said via including a chalcogenide material for a memory element;
    a heater above said select device and below said memory element; and
    a dielectric over said heater.

29. The system of claim 28, including an aperture through said dielectric.

30. The system of claim 29, wherein said memory element chalcogenide material is in said aperture in said dielectric in contact with said heater.

* * * * *